(12) United States Patent
Chen et al.

(10) Patent No.: US 8,178,289 B2
(45) Date of Patent: *May 15, 2012

(54) SYSTEM AND METHOD FOR PHOTOLITHOGRAPHY IN SEMICONDUCTOR MANUFACTURING

(75) Inventors: Kuei Shun Chen, Hsin-Chu (TW); Chin-Hsiang Lin, Hsin-Chu (TW); David Ding-Chung Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/362,316

(22) Filed: Jan. 29, 2009

(65) Prior Publication Data

US 2009/0136876 A1 May 28, 2009

Related U.S. Application Data

(62) Division of application No. 11/216,658, filed on Aug. 31, 2005, now Pat. No. 7,501,227.

(51) Int. Cl.
*G03F 7/20* (2006.01)
*G03F 7/26* (2006.01)

(52) U.S. Cl. ...................................... 430/322

(58) Field of Classification Search .................. 430/311, 430/312, 394
See application file for complete search history.

(56) References Cited

U.S. PATENT DOCUMENTS

| 6,080,533 | A | 6/2000 | Huggins |
| 6,664,011 | B2 | 12/2003 | Yu et al. |
| 6,788,477 | B2 * | 9/2004 | Lin ................................ 359/820 |
| 7,501,227 | B2 * | 3/2009 | Chen et al. ..................... 430/312 |
| 2006/0082747 | A1 * | 4/2006 | Fukuhara et al. ............... 355/53 |

FOREIGN PATENT DOCUMENTS

| JP | 06-333795 | 12/1994 |
| JP | 07-211619 | 8/1995 |
| JP | 09293666 | 11/1997 |
| JP | 11-133585 | 5/1999 |
| JP | 2005-140997 | 6/2005 |
| JP | 2005064539 A | 10/2005 |

OTHER PUBLICATIONS

Switkes et al., "Resolution Enhancement of 157 nm Lithography by Liquid Immersion," J. Microlith. Microfab., Microsyst., vol. 1, No. 3, Oct. 2002, pp. 225-228.
Rothschild et al., "Liquid Immersion Lithography: Why, How and When?", J. Vac. Sci. Technol. B22(6), Nov./Dec. 2004, pp. 2877-2881.

* cited by examiner

*Primary Examiner* — Kathleen Duda
(74) *Attorney, Agent, or Firm* — Haynes and Boone, LLP

(57) ABSTRACT

A method for producing a pattern on a substrate includes providing at least one exposure of the pattern onto a layer of the substrate by a higher-precision lithography mechanism and providing at least one exposure of the pattern onto a layer of the substrate by a lower-precision lithography mechanism. The exposures can be done in either order, and additional exposures can be included. The higher-precision lithography mechanism can be immersion lithography and the lower-precision lithography mechanism can be dry lithography.

8 Claims, 9 Drawing Sheets

SYSTEM AND METHOD FOR PHOTOLITHOGRAPHY IN SEMICONDUCTOR MANUFACTURING

CROSS REFERENCE

This application is a Divisional of U.S. patent application Ser. No. 11/216,658, filed Aug. 31, 2005, which is hereby incorporated by reference in its entirety.

BACKGROUND

The present disclosure relates generally to the manufacturing of semiconductor devices, and more particularly to a photolithography process in semiconductor manufacturing.

Since the inception of the semiconductor industry, photolithography has been used for forming the components of integrated circuits. Generally, light beams pass through a mask, which has been patterned with a magnified image of the relevant integrated circuits. The light beams are then focused by a projection lens on to a wafer, resulting in an image of the integrated circuits in the photoresist layer of the wafer.

Among other factors, the resolution of the image is related to the radiation wavelength and the numerical aperture of the optical system. Specifically, it is desirable to achieve a combination of a small wavelength and a large numerical aperture for printing dense circuits.

Enhancements are often needed to accommodate the increased density of integrated circuits. Some enhanced lithography techniques focused on reducing the radiation wavelength. Currently, state of the art lithography systems use 193 nm as the radiation wavelength for producing semiconductor devices that include more than one half billion transistors on each device.

However, it is impractical to continue reducing the radiation wavelength, as light beams with a wavelength smaller than 193 nm are absorbed by, rather than pass through, projection lenses that convey the light beams onto the wafer.

Therefore, to continue the advancement of semiconductor fabrication, it is desirable to further enhance the lithography by, for example, improving the numerical aperture of the optical system. One such enhanced lithography technique that achieves an improved numerical aperture of the optical system is immersion lithography. In immersion lithography (also known as wet lithography), water is inserted between the projection lens and the wafer (in contrast, air is permeated between the projection lens and the wafer in dry lithography). Since water has a refractive index of 1.4, the resulting numerical aperture of the optical system is increased by a factor of 1.4. Accordingly, image resolution may be significantly enhanced.

Although immersion lithography works well in increasing image resolution during semiconductor fabrication, multiple exposures are still often necessary for the required critical dimension (CD) uniformity and endcap performance with respect to certain semiconductor devices. The costs associated with enhanced lithography techniques like immersion lithography can therefore be undesirable, especially with multiple exposures.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
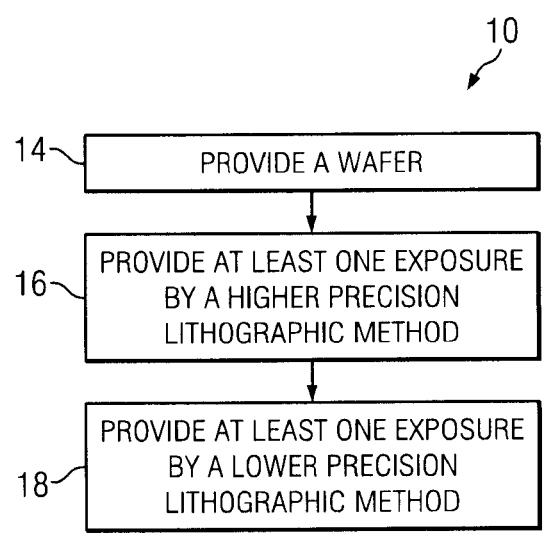
FIG. 1 illustrates a method of photolithography for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

In one embodiment, the present disclosure provides multiple exposures to a wafer. One or more of the multiple exposures are provide by a high-precision lithographic method, such as immersion lithography, while one or more other exposures are provided by low-precision lithographic methods, such as dry lithography. The sequence of the exposures can be different in different embodiments. For example, a high precision exposure can be done first, followed by a low-precision exposure. In another example, the order can be reversed. In a third example, all the exposures can be immersion, with some exposures having a higher precision than others. Likewise, in another embodiment, all the exposures can be dry, with some exposures having a higher precision than others. In such a manner, the cost and precision of a double exposure process is balanced to include the precision benefit (e.g., from using 193 nm wavelength immersion lithography) of the high-precision exposure and the cost benefit (e.g., from using 193 nm wavelength dry lithography) of the low-precision exposure.

Referring now to FIG. 1, shown therein is a simplified photolithography method 10 for implementing one or more embodiments of the present invention. Step 14 provides a wafer. Pursuant to step 16, at least one exposure is provided to the wafer by immersion lithography, and one or more exposures are provided to the wafer by dry lithography pursuant to step 18.

The method 10 may be utilized in the fabrication of a variety of semiconductor devices, such as memory devices (including but not limited to a static random access memory (SRAM)), logic devices (including but not limited to a metal-oxide semiconductor field-effect transistor (MOSFET)), and/or other devices. The method 10 may be especially applicable to fabricating semiconductor devices that are smaller than 56 nm in feature size. The method 10 will be further described in connections with FIGS. 2-8.

FIGS. 2-6, which illustrate an exemplary trim process, will now be described to illustrate a double exposure process utilizing a more-enhanced technique such as immersion lithography for a first exposure, and a less-enhanced technique such as dry lithography for a second exposure.

Figure 2:
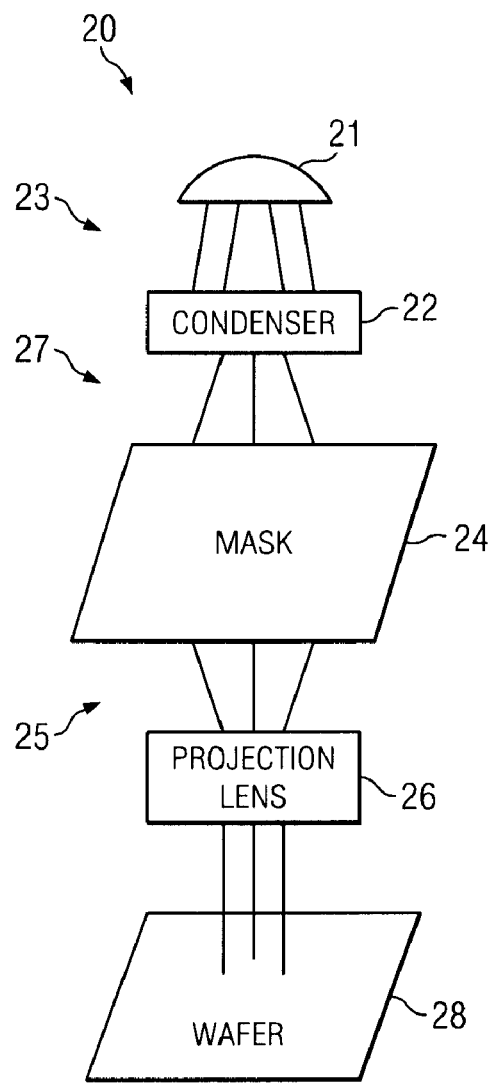
FIG. 2 illustrates a photolithography system for implementing one or more embodiments of the present invention.

Referring specifically to FIG. 2, a simplified exemplary photolithography system 20 includes a light source 21 for emitting light beams 23 condensed by a condenser 22. A mask 24, which includes patterns, is illuminated uniformly by light beams 27. After passing through the mask 24, light beams 25 are focused by a projection lens 26 prior to being projected onto a wafer 28.

Figure 3:
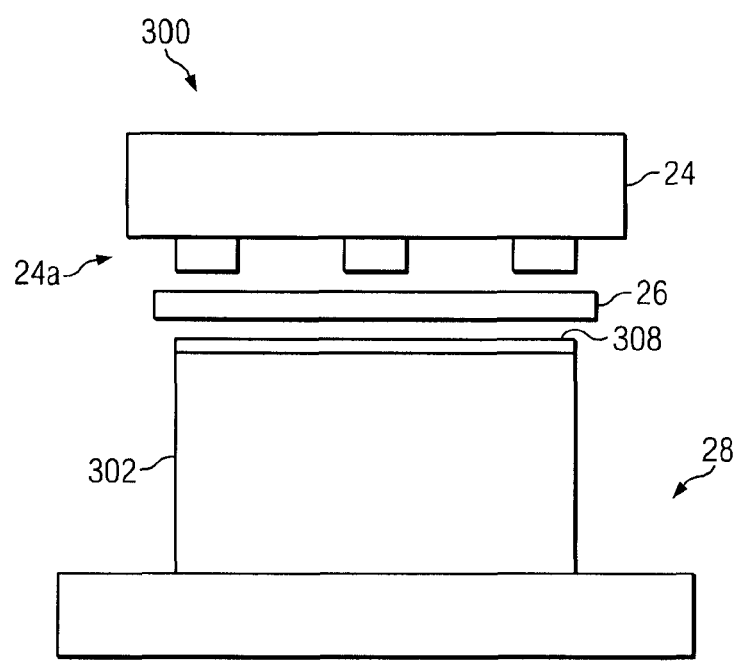
FIGS. 3-6 illustrate selected components of a photolithography system for implementing one or more embodiments of the present invention.

The first exposure of the double exposure process will now be further described. Referring now to FIG. 3, shown therein are selected components from the system of FIG. 2, which include the wafer 28, which is provided pursuant to step 14 of the method 10 (FIG. 1); the projection lens 26; and the mask 24.

In this embodiment, the wafer 28 includes a photoresist layer 302. The photoresist layer 302 may be deposited over the wafer by spin-on coating and/or other processes. In the present example, a photoresist solution is dispensed onto the surface of the wafer 28, which is spun rapidly until the photoresist solution is almost dry. In one example, the photoresist layer 302 may be a chemically amplified resist that employs acid catalysis. In this example, the photoresist layer may be formulated by dissolving an acid sensitive polymer in a casting solution.

The projection lens 26 may include fused silica (amorphous silicon dioxide) an/or any other suitable material known in the art.

The mask 24 may be a high precision plate containing microscopic images of electronic circuits. The mask 24 may include a variety of materials, such as quartz, soda lime, white crown, and/or other materials. Generally, a layer of chrome may be included on one side of the mask 24, and electronic circuits (frequently referred to as geometry) may be etched in the chrome layer (designated 24a). In one example, the thickness of the mask 24 may be approximately between about 60 mm to about 250 mm.

In one example, a liquid (not shown) may be interposed between the projection lens 26 and the wafer 28 to cover at least a portion thereof. The liquid may include water, doped water (Cr ion), a fluid having a PH value that is greater than 7, a fluid having a refractive index that is greater than 1, and/or other substance. In one embodiment, a liquid film 308, which may cover the exposed area of the wafer 28, may be injected by an opening in a housing for the projection lens 26.

Pursuant to step 16 of the method 10, the first exposure of the wafer 28 is provided by immersion photolithography. In one example, the immersion lithography may include a light source (not shown), such as an electromagnetic source with a wavelength that is not greater than 250 nm, and/or other light sources. In one embodiment, the wavelength of the light beams emitted from the light source is about 193 nm, 157 nm, and/or other figures. It is contemplated that the numerical aperture (NA) of the optical system may be larger than about 0.75.

Figure 4:
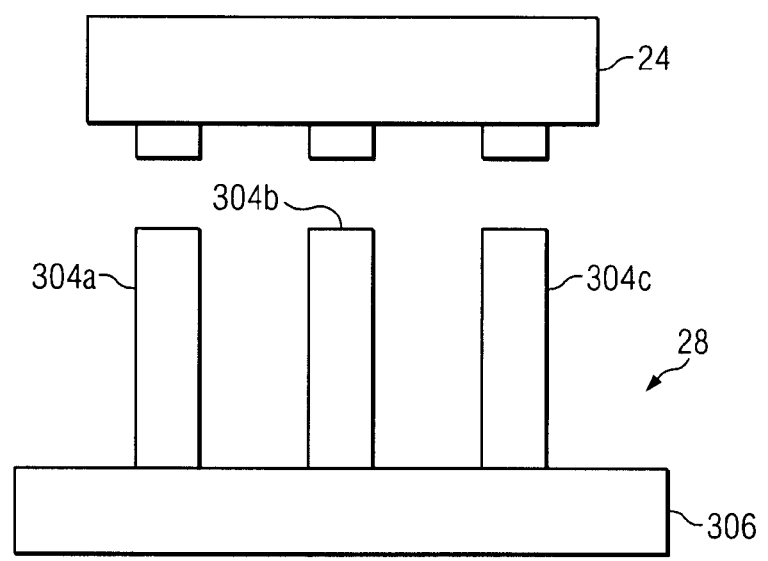

Referring now to FIG. 4, following the first exposure, the liquid film 308 may be removed by a vacuum (not shown) and/or other suitable methods. Thereafter, the photoresist layer 302 may be developed by methods known in the art, resulting in photoresist structures 304a, 304b, and 304c.

Figure 5:
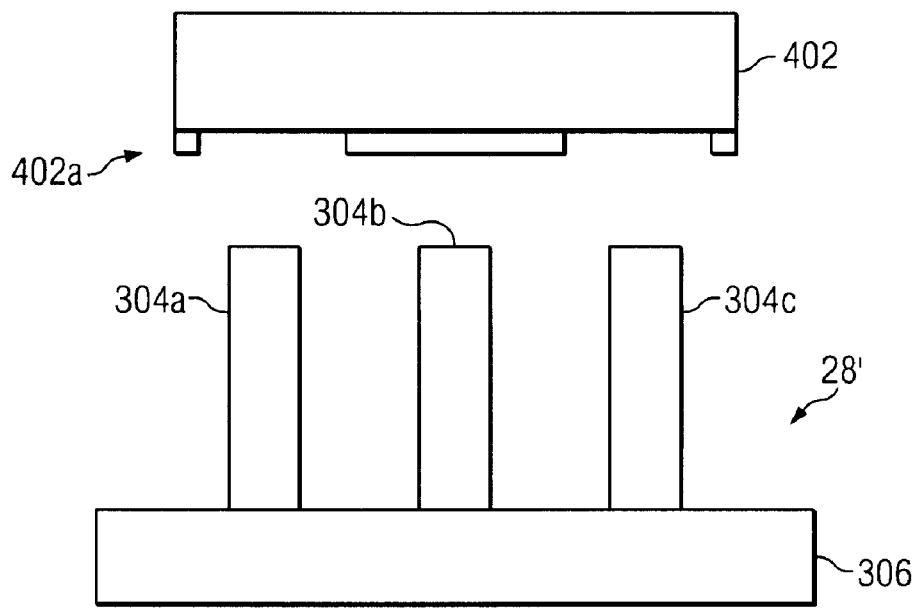

Pursuant to step 18 of the method 10 (which may be performed before step 16 in some embodiments), the second exposure of the wafer 28 is provided by dry lithography. Referring now to FIG. 5, shown therein are selected components of a lithography system that includes a mask 402 and the wafer 28'. Again, the mask 402 may be a high precision plate containing microscopic images of electronic circuits, and may include a variety of materials, such as quartz, soda lime, white crown, and/or other materials. Generally, a layer of chrome may be included on one side of the mask 402, and electronic circuits (frequently referred to as geometry) may be etched in the chrome layer (designated 402a).

The second exposure may be accomplished by dry photolithography, which may include any method known in the art. The radiations wavelengths of the dry lithography may be about 193 nm, 248 nm, and/or other figures. It is noted that in some embodiments, the mask 402 may be eliminated to accomplish a maskless exposure.

In another example, both the first exposure and exposures are all accomplished by immersion lithography with different numerical apertures. For instance, when exposing a high duty ratio region and a low duty ratio region in a single chip, a first immersion lithography with larger numerical aperture can be used to expose the high duty ratio region and a second immersion lithography with a smaller numerical aperture to expose the low duty ratio region. Although the manufacturing cost is more, using the larger numerical aperture to expose the high duty ratio region can provide a better image resolution. On the other hand, using the smaller numerical aperture to expose the low duty ratio region can reduce manufacturing cost. In some embodiments, both the first immersion and second immersion lithography are performed in same exposure tool, such as stepper or scanner, to maintain overlay quality. In furtherance of the present example, the line/space pitch in the high duty ratio region is equal to or less than about 0.25 um, and the line/space pitch in the low duty ratio region is greater than about 0.25 um.

Figure 6:
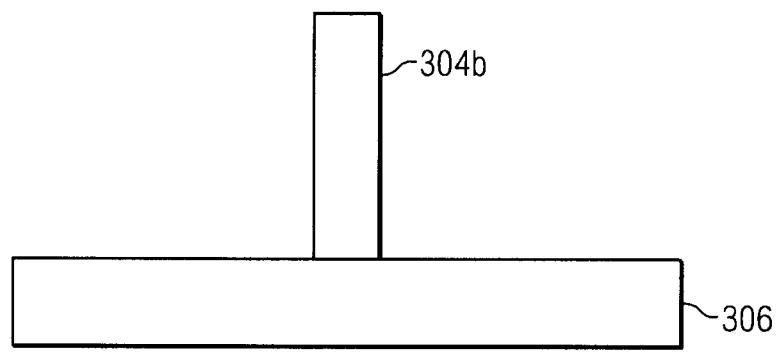

Referring also to FIG. 6, following the second exposure and development, the photoresist layers 304a and 304c of FIG. 5 are removed.

It is noted that in the above example, the first exposure may be provided by dry lithography, and the second exposure may be provided by immersion lithography instead. It is also noted that with respect to the above example, additional exposures, which may be accomplished by immersion lithography and/or dry lithography, are also contemplated.

It is noted that many applications of the method 10 are contemplated by the present disclosure. In a second example, the method 10 may be applied to a process entailing a hybrid pattern of active and dummy patterns, such as a hole printing process using phase-shifting masks (Pad Process). The Pad Process is further described in U.S. Pat. No. 6,664,011 B2 to Lin et al., which is hereby incorporated by reference in its entirety.

Figure 7A:
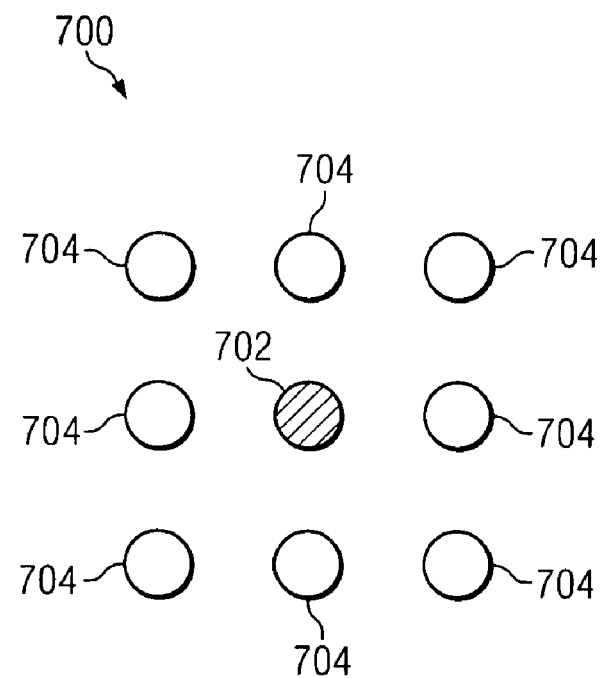
FIGS. 7a-7b illustrate photoresist patterns for implementing one or more embodiments of the present invention.

Referring now to FIG. 7a, shown therein is a top view of a photoresist pattern 700 according to one or more embodiments of the present disclosure. In this embodiment, pursuant to step 16 of the method 10, a wafer (FIG. 1) is first exposed by 193 nm wavelength immersion lithography with a first mask, and the photoresist pattern 700 is formed following development of a photoresist layer (not shown). In this illustration, an active pattern 702 is surrounded by dummy patterns 704. The dummy patterns 704 may include dummy bars, virtual bars for line end, virtual bars for corner rounding, dummy pads, and/or other patterns.

Figure 7B:

Referring now to FIG. 7b, pursuant to step 18 of the method 10, the dummy patterns 704 may be eliminated through a second exposure utilizing 248 nm wavelength dry lithography. It is contemplated that the second exposure may be accomplished with a second mask. Alternatively, the second exposure may be performed without any mask. In one example, the light source of the dry lithography may include an electromagnetic source, a beam source and/or other suitable sources. It is noted that the second exposure may also be accomplished by immersion lithography.

Figure 8A:
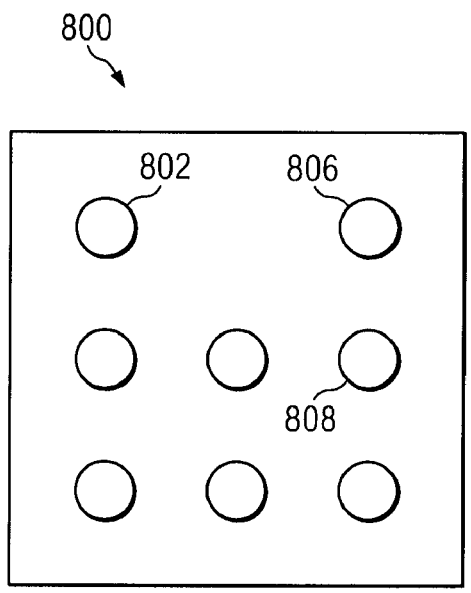
FIGS. 8a-8b illustrate photoresist patterns for implementing one or more embodiments of the present invention.
Figure 8B:
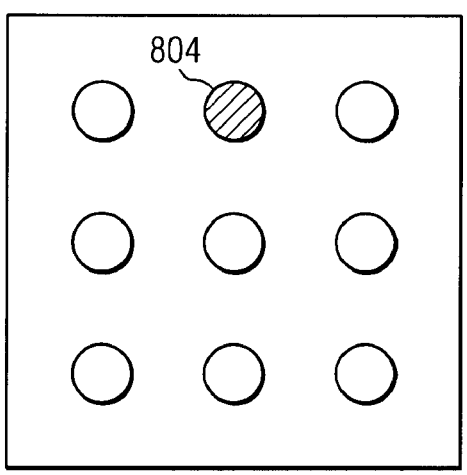

In a third example, the method 10 may be applied to a blind hole process. Referring now to FIG. 8a, shown therein is an exemplary top view of a photoresist pattern 800 that is formed pursuant to step 16 of the method 10, which exposes a wafer by 193 nm wavelength immersion lithography. In this illustration, the photoresist resist pattern 800 lacks the pattern 804 (shown in FIG. 8b). Pursuant to step 18 of the method 10, a second exposure is provided to the wafer by 193 nm wavelength dry lithography. It is understood that one or more intermediate steps may be performed (such as depositing an additional photoresist layer and/or other steps), as is well known in the art. The dry lithography may include any methods known in the art with or without a mask, including but not limited to e-beam exposure. Thereafter, the desired pattern 804 of FIG. 8b is formed following the development process. It is noted that the second exposure may also be accomplished by immersion lithography. For example, the first exposure is 193 nm wavelength immersion lithography and the second exposure is 248 nm wavelength immersion lithography.

Many variations of the above examples are contemplated herein. In one example, if the method 10 is applied to a hybrid pattern comprising active and dummy patterns, then the critical dimension (CD) of the active pattern may include a line CD that is not greater than 90 nm, a space CD that is not greater than 120 nm, and/or a hole CD that is not greater than 120 nm. In another example, the method 10 may be applied to a multi-exposure process that includes a single photoresist layer or a plurality of photoresist layers. In a third example, the method 10 may be applied to a multi-exposure process that includes a single etching process following the multiple exposures. In a fourth example, a plurality of etching steps, each of which is applied to the wafer following a single exposure process, may be used. In a fifth example, the method 10 may be applied to a variety of processes, such as line end shortening, removing at least one dummy gate, repairing missing patterns, decreasing the disparity effect between dense and isolated patterns, and/or other processes.

Figure 9:
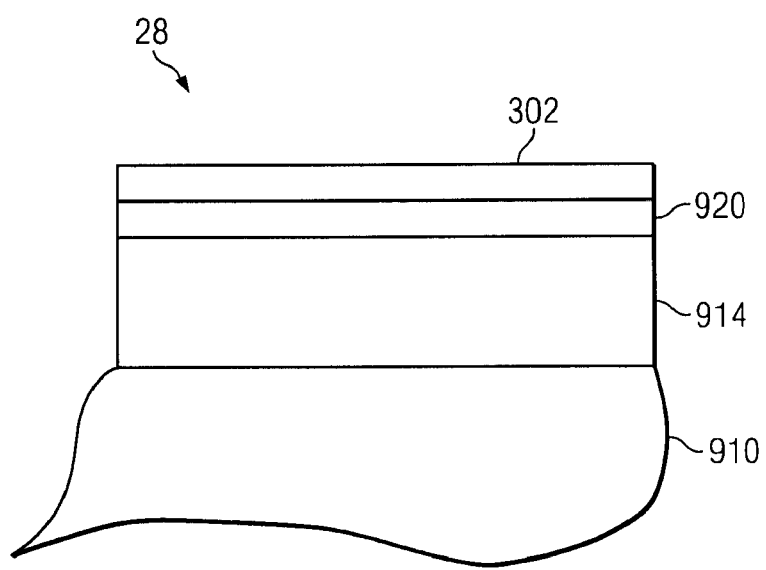
FIG. 9 illustrates a wafer for implementing one or more embodiments of the present invention.

Referring now to FIG. 9, for the sake of example, the wafer 28 of FIG. 3 is expanded to show a substrate 910, a dielectric layer 914, and a bottom anti-reflective coating (BARC) layer 920.

The substrate 910 may include one or more insulator, conductor, and/or semiconductor layers. For example, the substrate 910 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 910 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 910 may also or alternatively include a multiple silicon structure or a multilayer compound semiconductor structure.

The dielectric layer 914 may be deposited over the surface of the substrate 910. The dielectric layer 914 may be formed by CVD, PECVD, ALD, PVD, spin-on coating and/or other processes. The dielectric layer 914 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

The BARC layer 920 may be deposited over the dielectric layer 914 by a variety of techniques, including but not limited to spin-on coating, PVD, CVD, and/or other processes.

In one example, the BARC layer 920 may absorb the light that inadvertently penetrates the bottom of a photoresist layer (not shown). To perform the light absorption, the BARC layer 920 may include a material with a high extinction coefficient, and/or considerable thickness. On the other hand, a high coefficient of the BARC layer 920 may lead to the high reflectivity of the BARC layer, which counters the effectiveness of the BARC layer 920. Accordingly, it is contemplated that the BARC layer 920 may possess a coefficient value at approximately between about 0.2 to about 0.5, and may possess a thickness of about 200 nm. However, it is noted that other ranges of coefficient values and thickness are also contemplated by the present disclosure.

Additionally or alternatively, an index matching approach may be adopted for the BARC layer 920. In that case, the BARC layer 920 may include a material with a refraction index and thickness that match those of the light. In operation, once the light strikes the BARC layer 920, a portion of the light is reflected therefrom. Meanwhile, another portion of the light enters the BARC layer 920 and is transformed into a light with a shifted phase, which interferes with the first portion of the light that is reflected from the BARC layer 920, resulting in the reduction of the light reflectivity.

It is contemplated that the BARC layer 920 may employ both the light absorption and index matching approaches to achieve the desired results. In some instances, the BARC layer 920 may simply remain over the dielectric layer 914 and serve as a diffusion barrier for the wafer 18, as the removal of the BARC layer 920 may be difficult to accomplish.

Following the deposition of the photoresist layer, the wafer 28 may undergo soft bake and a double exposure process (described above in connection with the method 10).

Thereafter, additional steps are adopted for forming a complete semiconductor device. Since those additional steps are known in the art, they will not be further described herein.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A method for producing a pattern on a substrate layer having a plurality of regions, the method comprising:
   identifying at least one of the regions from the plurality of regions as a high duty ratio region;
   identifying at least one of the regions from the plurality of regions as a low duty ratio region, wherein the high duty ratio region has a higher duty ratio than the low duty ratio region;
   performing a dry lithography with a first numerical aperture on the high duty ratio region; and performing an immersion lithography with a second numerical aperture on the low duty ratio region, wherein the first numerical aperture is larger than the second numerical aperture;

whereby the pattern is produced on the substrate layer by the dry and immersion lithography performances.

2. The method of claim 1 wherein the dry lithography and the immersion lithography are performed in a common exposure tool.

3. The method of claim 2, wherein the exposure tool is a stepper or a scanner.

4. The method of claim 1, including:
wherein the high duty ratio region has a line/space pitch equal to or less than about 0.25 um; and
wherein the low duty ratio region has a line/space pitch greater than about 0.25 um.

5. A method for producing a pattern on a substrate layer having a plurality of regions, the method comprising:
determining whether each of the plurality of regions is a high duty ratio region or a low duty ratio region, wherein the high duty ratio regions have a higher duty ratio than the low duty ratio regions;
performing a first lithography with a first numerical aperture on each of the high duty ratio regions, the first lithography being one of a dry lithography and an immersion lithography;
performing a second lithography with a second numerical aperture on each of the low duty ratio regions, wherein the first numerical aperture is larger than the second numerical aperture, and wherein the second lithography is the other one of the dry lithography and the immersion lithography such that the first and second lithographies are different; and
whereby the pattern is produced on the substrate layer by the first and second lithography performances.

6. The method of claim 5, wherein the first lithography and the second lithography are performed in a common exposure tool.

7. The method of claim 5, wherein the exposure tool includes one of a stepper and a scanner.

8. The method of claim 5, wherein each of the high duty ratio regions has a line/space pitch equal to or less than about 0.25 um and each of the low duty ratio regions has a line/space pitch greater than about 0.25 um.

* * * * *